(12) United States Patent
Cucchi et al.

(10) Patent No.: US 7,840,867 B2
(45) Date of Patent: Nov. 23, 2010

(54) ITERATIVE N-DIMENSIONAL DECODING

(75) Inventors: Silvio Cucchi, Gaggiano (IT); Sonia Rinaldi, Tirano (IT); Gianluca Macheda, Casatenovo (IT)

(73) Assignee: Alcatel, Paris (FR)

( * ) Notice: Subject to any disclaimer, the term of this patent is extended or adjusted under 35 U.S.C. 154(b) by 636 days.

(21) Appl. No.: 10/992,650

(22) Filed: Nov. 22, 2004

(65) Prior Publication Data

US 2005/0182998 A1    Aug. 18, 2005

(30) Foreign Application Priority Data

Feb. 13, 2004    (EP)    ................... 04290409

(51) Int. Cl.
*H03M 13/00*    (2006.01)
*G11C 29/00*    (2006.01)
(52) U.S. Cl. .................. 714/755; 714/765; 714/784
(58) Field of Classification Search ................ 714/755, 714/756, 784, 765
See application file for complete search history.

(56) References Cited

U.S. PATENT DOCUMENTS

| | | | |
|---|---|---|---|
| 4,809,276 A * | 2/1989 | Lemay et al. ............... 714/704 |
| 4,881,232 A | 11/1989 | Sako et al. |
| 5,255,136 A * | 10/1993 | Machado et al. ......... 360/77.02 |
| 5,261,068 A * | 11/1993 | Gaskins et al. .............. 711/157 |
| 5,381,422 A | 1/1995 | Shimizu |
| 5,631,914 A | 5/1997 | Kashida et al. |
| 5,687,182 A | 11/1997 | Shikakura |
| 5,974,580 A * | 10/1999 | Zook et al. ................... 714/755 |
| 5,991,911 A * | 11/1999 | Zook ........................... 714/758 |
| 5,996,105 A | 11/1999 | Zook |
| 6,009,548 A * | 12/1999 | Chen et al. .................. 714/762 |
| 6,032,283 A | 2/2000 | Meyer |
| 6,047,395 A | 4/2000 | Zook |
| 6,052,815 A | 4/2000 | Zook |
| 6,223,321 B1 | 4/2001 | Nasu et al. |
| 6,651,208 B1 | 11/2003 | Tran et al. |
| 6,691,203 B1 | 2/2004 | Chen et al. |
| 2005/0182998 A1* | 8/2005 | Cucchi et al. ............... 714/785 |

FOREIGN PATENT DOCUMENTS

| | | |
|---|---|---|
| EP | 1 030 456 A2 | 8/2000 |
| EP | 1 104 114 A2 | 5/2001 |
| EP | 1 324 501 A1 | 7/2003 |

* cited by examiner

*Primary Examiner*—Joseph D Torres
(74) *Attorney, Agent, or Firm*—Sughrue Mion, PLLC

(57) ABSTRACT

A method for performing an iterative n-dimensional decoding of a data structure comprising a data bit frame. The method includes receiving possibly errored data; computing syndromes in all the n dimensions in a single step; storing the first calculated syndromes; processing syndromes in a first dimension; correcting errors; and updating the syndromes which have been affected by the correction in the first dimension; and processing syndromes in all the possible dimensions up to the n-th one and, for each of the processed syndromes, correcting errors and updating the syndromes in all the dimensions which have been affected by the correction. The time required by each sub-iteration (from second sub-iteration on) will be progressively reduced. The number of iterations is increased without increasing the delay and processing complexity.

13 Claims, 3 Drawing Sheets

(state of the Art)

(state of the Art)

ITERATIVE N-DIMENSIONAL DECODING

BACKGROUND OF THE INVENTION

1. Field of the Invention

The present invention relates to the telecommunication field and more in particular to the art of error correction which could be originated during the transmission of signals. Still more in particular, the present invention relates to an improved iterative n-dimensional FEC decoder and an improved method for decoding signals.

This application is based on, and claims the benefit of, European Patent Application No. 04290409.4 filed on Feb. 13, 2004, which is incorporated by reference herein.

2. Description of the Prior Art

As it is known, the Forward Error Correction (FEC) is a technique by means of which redundancy is transmitted together with transported data, using a pre-determined algorithm. The receiving device has the capability of detecting and correcting multiple bit errors that could occur during transmission thanks to the redundancy. The signal transmitted with FEC is more "robust" thus allowing operators to build up longer distance connections without the deployment of many repeater stations.

In other words, in order to overcome transmission errors and packet loss, many telecommunication systems use forward error correction (FEC). In general, FEC schemes transmit extra data which can be used at the receiving end to re-create any corrupted or lost packets. For instance, FEC has been applied to CD-ROMs to compensate for scratches, and used in satellite and deep-space transmissions, since the broadcast is in only one direction (i.e. the receiver is incapable of asking for retransmission).

A known method for performing a decoding of an n-dimensional code consists in decoding first along a first dimension, then along a second dimension, then along a third dimension up to the $n^{th}$ dimension. Moreover, in order to improve the error correction capability, it is possible to carry out a number of iterations similar to the above mentioned one (namely, decoding in a $1^{st}, 2^{nd}, 3^{rd}, \ldots n^{th}$ dimension). Each iteration results in a delay or latency.

In turn, the step of decoding in one dimension comprises: calculating syndromes, calculating error positions and error values; and finally performing correction in that dimension.

These operations are iterated along the n dimensions.

The processing of calculated syndromes allows establishing how many errors are present and where they are located.

In other words, the computed syndromes provide information from which the error positions and their value can be derived.

The error position calculation step is generally carried out by verifying an equation at all the possible points (positions, CHIEN search). A better alternative consists in making a calculation in a closed form.

The known solution results in two main disadvantages. The first disadvantage is a high latency that depends on the number of iterations that are performed for correcting errors. To increase the error correctability, as said above, it is necessary to carry out a number of iterations, each single iteration resulting in a latency. This implies that, in order to raise the net coding gain of a decoder, it is necessary to increase the number of iterations and then the latency. The second disadvantage is given by the complexity of the decoder. In fact, it is requested to re-compute all the syndromes at each decoding step which is considered as a single sub-iteration independent from the others.

SUMMARY OF THE INVENTION

In view of the above problems and disadvantages, the main object of the present invention is providing a FEC decoder structure and decoding method resulting in a reduced latency while performing a higher number of iterations with respect to the known decoders. A further object of the present invention is providing a FEC decoder structure and decoding method which is less complex with respect to the known decoders and methods.

These and further objects are reached by a decoder according to claim 1 and a method according to claim 13. Further advantageous features of the present invention are set forth in the respective dependent claims. All the claims should be deemed to be an integral part of the present description.

The present invention is based on the fact that, being the algebraic codes resolvable by a closed formula up to a fourth grade equation, for a n-dimensional code, in which each dimension is protected by an algebraic code having a grade $\leq 4$, it is possible to use an innovative decoding computing structure that use a closed form solution to calculate errors values and their positions. Such a novel computing structure does not need to compute all syndromes (in all dimensions) at each decoding step. According to the present invention, all the syndromes in all dimensions are profitably computed once at the beginning before the decoding steps substantially at the same time.

After that, during the decoding step that will be described more deeply later, when a bit is corrected, all the syndromes affected by such a correction are updated.

Moreover, another characteristic of the present invention is not to process, from the second iteration up to the nth iteration, all the syndromes but only the syndromes with a value different from zero or the syndromes that have been updated during the previous decoding step.

In this way, the time required by each sub-iteration (from second sub-iteration on) will be progressively reduced.

Thus, advantageously, the present invention allows increasing the number of iterations without increasing the delay and processing complexity.

Processing complexity is also reduced because only one circuit is used to process the syndromes in all the dimensions and for all the iterations.

According to a first aspect, the present invention provides a decoder for performing an iterative n-dimensional decoding of a data structure comprising a data bit frame, the decoder comprising: a syndrome calculator for computing syndromes in all the n dimensions in a single step; a syndrome processor for processing the syndromes in 1, 2, ... n dimensions, the syndrome processor comprising storage means for storing the syndromes; and a data processor for storing received data, correcting data according to information from the syndrome processor and outputting corrected data.

The syndrome processor generally processes the syndromes for 1, 2, ..., m iterations.

According to a preferred embodiment, the syndrome processor comprises an error calculator respondent to said syndrome storage means for calculating errors and providing error values and error positions to said data processor and correcting possible errors of stored data.

Moreover, said error calculator cooperates with a calculator of new syndromes in the syndrome processor for computing new syndromes that have been changed by the previous correction in one dimension, said new syndromes being calculated for all the dimensions.

Profitably, the output from the new syndromes calculator is provided to said syndrome storage means for updating the syndromes stored therein.

Optionally, the syndrome processor further comprises a sequencer for managing a number of syndrome correction iterations in a preset time interval, said sequencer cooperating with the error calculator and the syndrome storage means.

Typically, the syndrome processor comprises a syndrome multiplexer for switching between an output of the syndrome calculator and an output of the calculator of new syndromes.

Profitably, the data processor comprises a first memory and a second memory and an output multiplexer switching between said first or second memories.

Typically, each memory is associated with a data multiplexer switching between input data and the output from said syndrome processor.

Possibly, an erasure FEC decoder block could be provided for performing a correction of remaining errors, if any.

According to a preferred and advantageous embodiment, the decoder operates in two dimensions.

Profitably, the decoder is embodied in an application-specific integrated circuit, ASIC.

According to a second aspect, the present invention provides a method for performing an iterative n-dimensional decoding of a data structure comprising a data bit frame, the method comprising the steps of:

receiving possibly errored data;

computing syndromes in all the n dimensions in a single step;

storing the first calculated syndromes;

processing syndromes in a first dimension; correcting errors; updating the syndromes which have been affected by the correction in said first dimension;

processing syndromes in all the possible dimensions up to the n-th one and, for each of the processed syndromes, correcting errors and updating the syndromes in all the dimensions which have been affected by the correction;

carrying out an iterative procedure up to the end of a set time frame, the iterative procedure comprising the following steps:

processing in a first dimension the syndromes that are not null; correcting errors; updating the syndromes which have been affected by the correction in said first dimension;

processing the syndromes that are not null, or the syndromes that have been updated during the previous step, in all the possible dimensions up to the n-th one and, for each of the processed syndromes, correcting errors and updating the syndromes in all the dimensions which have been affected by the correction, and outputting corrected data.

Possibly, an erasure FEC decoding step is performed for correcting remaining errors, if any.

Preferably, n is equal to 2.

Profitably, the method is performed by an application-specific integrated circuit, ASIC.

According to a third aspect, the present invention further provides a telecommunication apparatus, typically a network element, comprising a decoder as set above.

According to a fourth aspect, the present invention further provides a computer program comprising computer program means adapted to perform the method as set above when said program is run on a computer.

According to a fifth aspect, the present invention provides a computer readable medium having a program recorded thereon, said computer readable medium comprising computer program code means adapted to perform the method as set forth above when said program is run on a computer.

The present invention will become fully clear after reading the following detailed description, given by way of example only and not of limitation, to be read having reference to the accompanying drawings,

BEST MODE FOR CARRYING OUT THE INVENTION

Before starting with the description of the present invention, a definition of syndrome will be given. Let C be a linear (n, k, d) code over $F=GF(q)$ and let H be a (n−k×n) parity-check matrix of C such that for every $c \in F^n$, $c \in C \Leftrightarrow Hc^T$. The syndromes of a word $y \in F^n$ (with respect to H) is defined by $S=H\ y^T$. The codewords of C are exactly the vectors of $F^n$ whose syndromes are 0.

Figure 1:
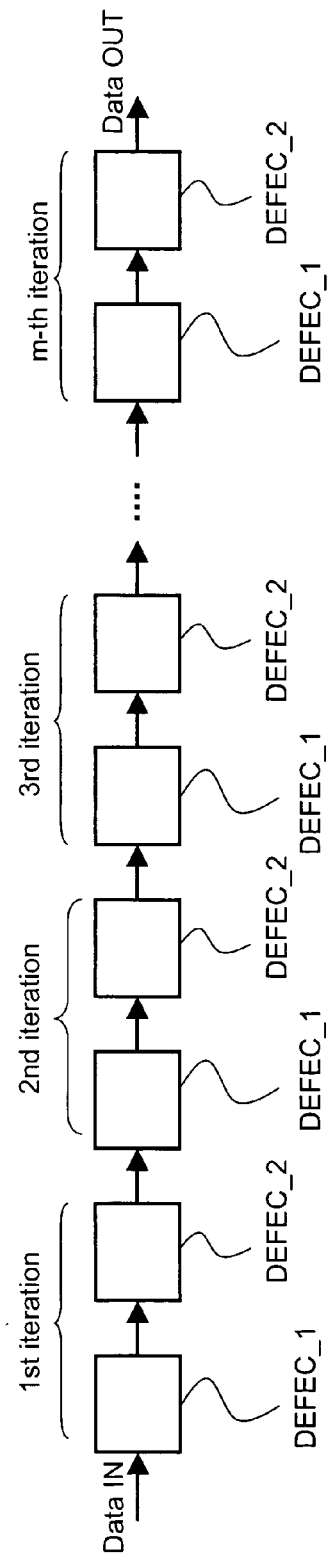
FIG. 1 diagrammatically shows a known method for performing a decoding of a two-dimensional code.
Figure 2:
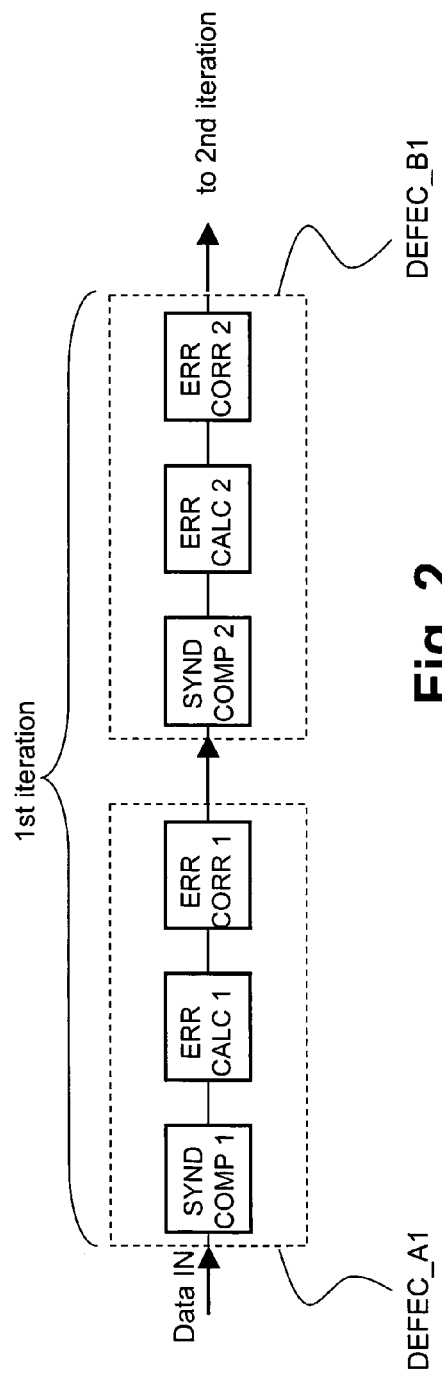
FIG. 2 shows a single iteration in detail.

As said above, a known method for performing a decoding of an n-dimensional code consists in decoding first along a first dimension, then along a second dimension, then along a third dimension up to the $n^{th}$ dimension. Moreover, in order to improve the error correction capability, a number (m) of iterations similar to the above mentioned one (namely, decoding in a $1^{st}, 2^{nd}, 3^{rd}, \ldots n^{th}$ dimension) is generally carried out. Each of the m iterations results in a delay or latency. FIGS. 1 and 2 show such a known method for the two-dimensional case (n=2). Each of the iterations comprises the sub-iteration steps of decoding first along the first dimension (DEFEC_1) and then along the second dimension (DEFEC_2). In turn, each of the sub-iteration steps comprises the steps of computing the code syndromes (SYND_COMP), calculating errors (ERR_CALC) and correcting errors (ERR_CORR).

Differently, according to the present invention, syndromes are computed only at the beginning of the decoding. Then, only when a bit is corrected it is simply necessary to update those syndromes (in all dimensions) that are related to the corrected bit. Moreover, the present invention allows to increase the number of iterations without to increase the delay and processing complexity.

The idea is that, from the second iteration up to the $n^{th}$ iteration, it is not necessary to process all the syndromes but only the syndromes with a value different from zero or the syndromes that have been updated during the previous step. In this way, the time that each sub-iteration needs is reduced.

When a two-dimensional code is considered, the computing structure according to the present invention can be summarized by the following steps.

Calculating all the syndromes only at the beginning of the decoding.

Storing the syndromes in proper RAM memories.

Processing the syndromes along the first dimension. This step implies not only the calculation of errors and their consequent correction but also the re-computing of just the syndromes concerning the corrected bits. In fact, it has to take in consideration that if the errored bits are corrected in the data, it is necessary to re-compute the related syndromes in all dimensions (two in this two-dimensional case). These new syndromes have to take the place of the previous ones in the above-mentioned RAMs.

Processing the syndromes along the second dimension. This step is substantially as the above-described step.

Processing the syndromes along the first dimension.

Syndromes processing along the second dimension and so on until the time dedicated to the syndrome processing lapses.

It is clear that the decoding steps are not independent because it is necessary to update, at each sub-iteration, the syndromes that are related to the corrected bits in all the dimensions.

The number of the iterations depends on the time that a single sub-iteration needs and consequently on the time that is dedicated to the syndromes processing. For this reason, the present invention delineates also how to reduce the time that a single sub-iteration, except for the fist iteration (in this case every syndromes has to be considered), needs. In fact, starting from the second iteration up to the $n^{th}$ iteration, at each sub-iteration only the syndromes that have a value different from zero, or the syndromes that have been updated during the previous step, have to be processed. In this way in a fixed time it is possible to perform a number of iterations that depends on the number and position of errors.

On the contrary, in case of known decoding structures (see FIGS. 1 and 2), the number of iterations is fixed because each sub-iteration is equal, in term of the required time, to the previous one.

Figure 3:
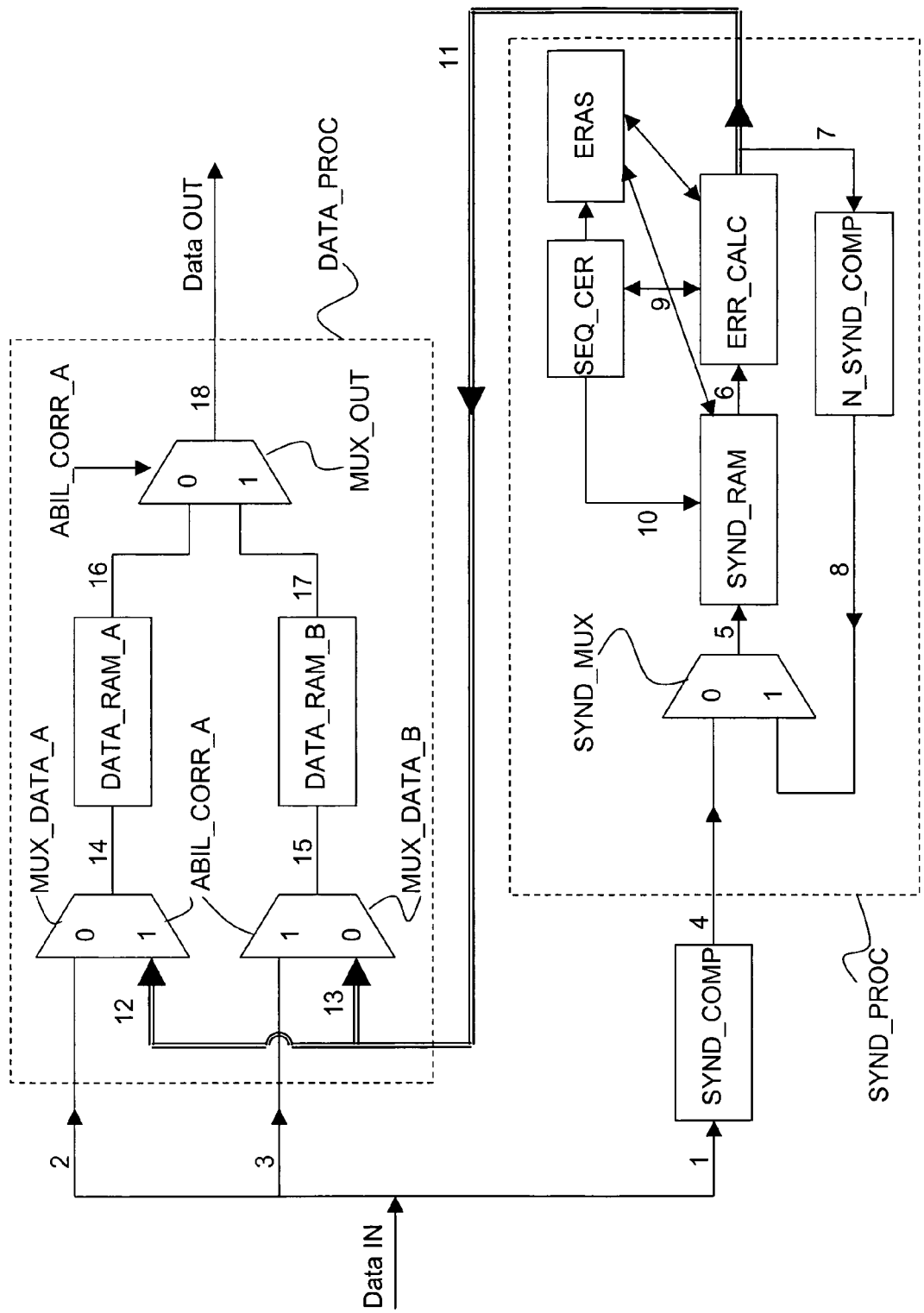
FIG. 3 shows an embodiment of a decoder according to the present invention.
Figure 4:
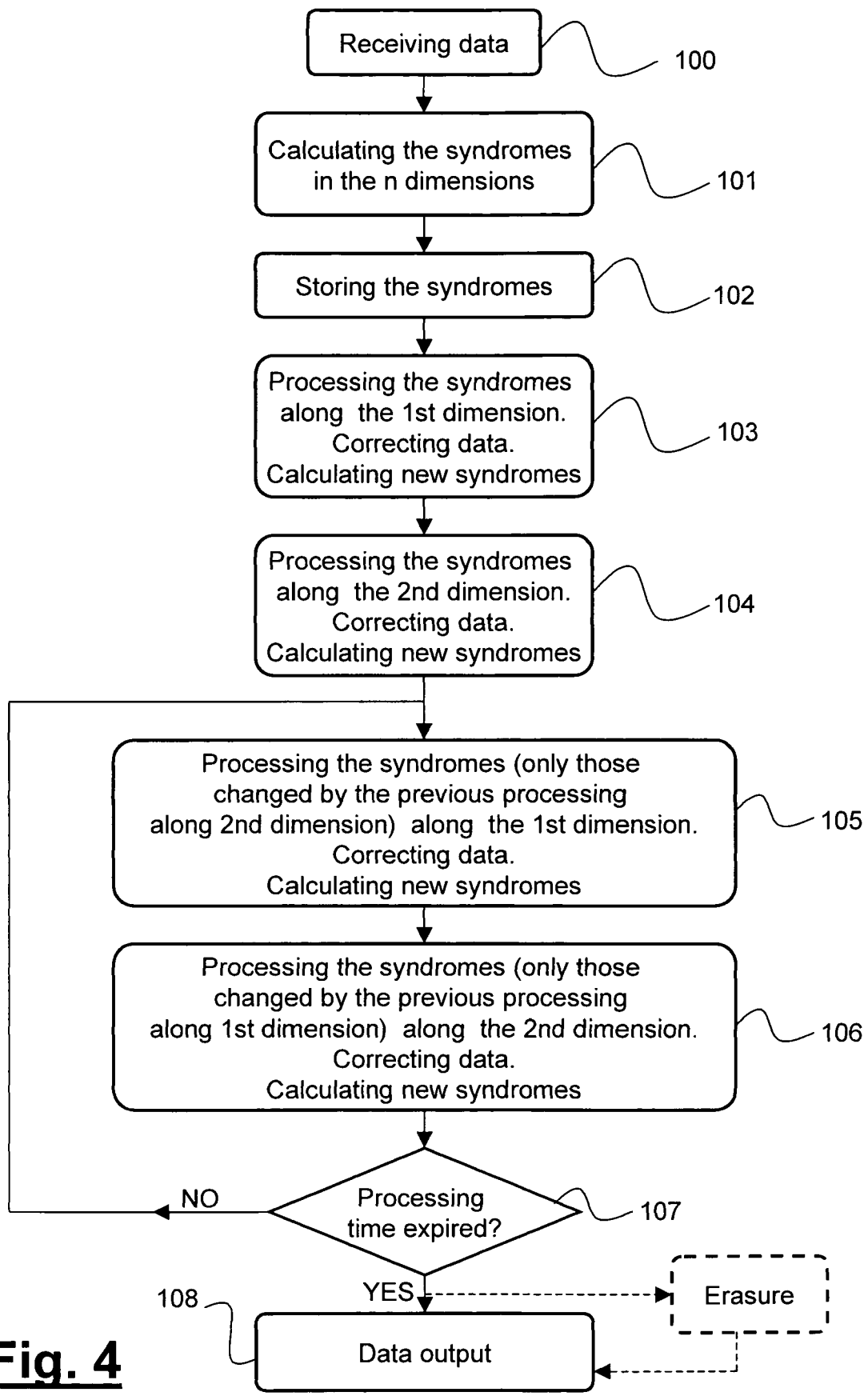
FIG. 4 shows the steps of a method according to the present invention, in a two-dimensional case.

A possible decoder structure according to the present invention is diagrammatically shown in FIG. 3. FIG. 4 shows the various steps of the method. Whist a decoder as in FIG. 3 could decode data protected by a n-dimensional code (with n=1, 2, 3, . . . ), the following description (see also block diagram of FIG. 4) will be given with particular reference to a two-dimensional code wherein n is equal to 2.

Step 100: data, in the form of bit frames, are received at an input (DATA_IN). Step 101: the received data are provided (1) to a block SYND_COMP for calculating the code syndromes for all the n dimensions of the code that is used and also sent (2, 3) to a data processor DATA_PROC. The calculated syndromes are provided (4) to a syndrome processor SYND_PROC. In the syndrome processor the calculated syndromes are stored (step 102) in a memory, preferably a random access memory, SYND_RAM. Indeed, the SYND_RAM memory comprises a plurality of memories for all the syndromes of the n dimensions. The syndromes are processed by an error calculator ERR_CALC. Profitbly, ERR_CALC calculates both positions and values of errors in a closed form.

In a first phase (step 103), the syndromes are processed along the first of the two dimensions, for instance, the horizontal dimension. The error calculator ERR_CALC generates information about error values and error positions which are provided to the data processor through 11 for correcting data. According to the information concerning error values and error positions along the first dimension, the syndromes along both the dimensions that become changed by the correction along the first dimension are updated.

In a second phase (step 104), the syndromes are processed along the second dimension, for instance a vertical or diagonal dimension of the code. The error calculator ERR_CALC generates information about error values and error positions which are provided to the data processor through 11 for correcting data. According to the information concerning error values and error positions along the second dimension, the syndromes along both the dimensions that become changed by the correction along the second dimension are updated.

In a third phase (step 105), the syndromes are processed again along the first dimension. Again, according to the present invention, only the syndromes that have been updated in the previous step, and having a value different from zero, are processed. The error calculator ERR_CALC generates information about possibly remaining error values and error positions which are provided to the data processor through 11 for correcting data. According to the information concerning remaining error values and error positions along the first dimension, the syndromes along both the dimensions that become changed by the correction along the first dimension are updated.

In a fourth phase (step 106), the syndromes are processed again along the second dimension. Again, according to the present invention, only the syndromes that have been updated in the previous step, and having a value different from zero, are processed. The error calculator ERR_CALC generates information about possibly remaining error values and error positions which are provided to the data processor through 11 for correcting data. According to the information concerning remaining error values and error positions along the second dimension, the syndromes along both the dimensions that become changed by the correction along the second dimension are updated.

The decoding will continue with an iterative process wherein the above third and fourth phases are repeated up to the end of a fixed time (block 107). Clearly, the time for each iteration will be iteratively reduced. Upon completion of the itertative process, the data is output (step 108).

The syndrome processor further comprises a sequencer SEQ_CER managing the sequence of the syndrome processing. The sequencer cooperates with the error calculator and the memory where syndromes are stored.

Profitably, the syndrome processor comprises also a syndrome multiplexer SYND_MUX for switching between the syndrome calculator SYND_COMP and the calculator of new syndromes N_SYND_COMP.

Profitably, the data processor DATA_PROC comprises two memories DATA_RAM_A and DATA_RAM_B connected through lines 14 and 15 to respective data multiplexers MUX_DATA_A, MUX_DATA_B. Each of the data multiplexer switches between the data input and the output from the syndrome processor. Finally, an output multiplexer MUX_OUT selects one of the outputs 16, 17 of the two memories. The memories are preferably random access memories. The reason why the memories are in number of two will become clear from the below description.

In FIG. 3, ABIL_CORR_A indicates a selector. When ABIL_CORR_A is set with 1, errors are corrected in data stored in DATA_RAM_A, new data DATA_IN are written in DATA_RAM_B and the data from DATA_RAM_B are sent to the output DATA_OUT.

Having clear the operation of the present invention, t will be further explained in terms of time intervals $\Delta t_1$, $\Delta t_2$, $\Delta t_3$, $\Delta t_4$ . . . , with each time interval being equal to a code frame. $\Delta t$ is a fixed time dedicated to processing. The number of iterations which could be performed depends on the time taken by each sub-iteration which reduces progressively.

In $\Delta t_1$: the input data (DATA_IN) are stored in DATA_RAM_A; the SYND_COMP calculates all the n syndromes of the data (DATA_IN_A) presently stored in DATA_RAM_A.

In $\Delta t_2$: the input data (DATA_IN) are stored in DATA_RAM_B; the SYND_COMP calculates all the n syndromes of the data (DATA_IN_B) presently stored in DATA_RAM_B. Furthermore, a processing of the syndromes and an error correction of data presently stored in DATA_RAM_A take place.

In $\Delta t_3$: the data, being corrected during the previous time interval ($\Delta t_2$), are output from DATA_RAM_A; new data could be stored in DATA_RAM_A; the SYND_COMP calculates all the n syndromes of the new data presently stored in DATA_RAM_A. Furthermore, a processing of the syndromes and an error correction of data presently stored in DATA_RAM_B take place.

In $\Delta t_4$: the data, being corrected during the previous time interval ($\Delta t_3$), are output from DATA_RAM_B; new data could be stored in DATA_RAM_B; the SYND_COMP calculates all the n syndromes of the new data presently stored in DATA_RAM_B. Furthermore, a processing of the syndromes and an error correction of data presently stored in DATA_RAM_A take place.

The next time intervals will be as $\Delta t_3$ and $\Delta t_4$. Thus, the latency between data input and data output will be equal to two code frames. In the prior art it was given by the number of iterations (m) multiplied by the length of a code frame.

There have thus been shown and described a novel decoder and a novel method which fulfil all the objects and advantages sought therefor. Many changes, modifications, variations and other uses and applications of the subject invention will, however, become apparent to those skilled in the art after considering the specification and the accompanying drawings which disclose preferred embodiments thereof. All such changes, modifications, variations and other uses and applications which do not depart from the scope of the invention are deemed to be covered by the invention which is limited only by the claims which follow.

For instance, by replacing SYND_COMP and ERR_CALC, the arrangement of FIG. 3 could be profitably used for several types of FECs. For instance, in case it is not possible to calculate the value and position of errors in a closed form, ERR_CALC should be changed (for performing a CHIEN search) but the general structure of the decoder (as shown in FIG. 3) would remain fundamentally unchanged.

We claim:

1. A decoder, which performs an iterative n-dimensional decoding of a data structure comprising a data bit frame, the data structure being coded by a n-dimensional code, in which each dimension is protected by an algebraic code having a maximum error correction capability $\leq 4$ bits/symbols, the decoder comprising:
   a syndrome calculating means, a syndrome processing means and a data processing means;
   the syndrome calculating means:
      for computing syndromes in all the n dimensions including a first dimension and a second dimension different from the first dimension in a single step,
      for calculating all the syndromes in all dimensions once during a first decoding step before any further decoding steps are performed by said decoder, and
      for outputting the syndromes to syndrome processing means;
   the syndrome processing means:
      for processing the syndromes output from the syndrome calculating means in the first dimension during a first iteration, comprising:
         calculating error positions and error values of the syndromes in the first iteration; and
         updating the syndromes in the first dimension and the second dimension when the syndromes are changed based on the error positions and error values calculated in the first iteration;
      for processing the syndromes output from the syndrome calculating means in the second dimension during the second iteration, comprising:
         calculating error positions and error values of the syndromes in the second iteration; and
         updating the syndromes in the first dimension and the second dimension when the syndromes are changed based on the error positions and error values calculated in the second iteration;
      for processing only syndromes with a value different from zero or syndromes that have been updated during a previous decoding step for a second iteration up through a last iteration,
      for updating all syndromes affected by a correction of a bit of data during subsequent decoding steps by said decoder; and
      for outputting information based on the processed syndromes,
      wherein said syndrome processing means comprises syndrome storage means for storing the syndromes; and
   data processing means
      for storing data received by the decoder,
      for correcting the data received by the decoder according to the information output by the syndrome processing means and
      for outputting corrected data.

2. The decoder according to claim 1, wherein the syndrome processing means further comprises error calculating means for responding to the syndrome storage means, for calculating errors, providing error values and error positions to said data processor, and correcting possible errors of stored data.

3. The decoder according to claim 2, wherein said error calculating means cooperates with new syndrome calculating means for calculating new syndromes in the syndrome processor in all dimensions for any syndrome that have been changed by a previous correction in any one dimension.

4. The decoder according to claim 3, wherein the output from the new syndrome calculating means is provided to said syndrome storage means to update the syndromes stored therein.

5. The decoder according to claim 3, wherein the syndrome processing means comprises a syndrome multiplexer, which switches between an output of the syndrome calculating means and an output of the new syndrome calculating means.

6. The decoder according to claim 2, wherein the syndrome processing means further comprises sequencing means for managing a number of syndrome correction iterations in a present time interval, said sequencing means cooperating with the error calculating means and the syndrome storage means.

7. The decoder according to claim 1, wherein the data processing means comprises a first memory and a second memory and an output multiplexer, which switches between said first and second memories.

8. The decoder according to claim 7, wherein each memory is connected to a data multiplexer, which switches between input data input into the decoder and the output information received from the_syndrome processing means.

9. The decoder according to claim 1, wherein the syndrome processing means processes the syndromes for 1, 2, . . . , m iterations.

10. The decoder according to claim 1, wherein only one circuit is used to process the syndromes in all the dimensions and for all the iterations.

11. The decoder according to claim 1, wherein the decoder is a multi-dimensional decoder which operates in two dimensions.

12. The decoder according to claim 1, wherein the decoder is embodied in an application-specific integrated circuit.

13. A network element apparatus comprising a decoder, which performs an iterative n-dimensional decoding of a data structure comprising a data bit frame, the data structure being coded by a n-dimensional code, in which each dimension is protected by an algebraic code having a maximum error correction capability $\leqq 4$ bits/symbols, wherein the decoder comprises:
- a syndrome calculating means, a syndrome processing means and a data processing means;
- the syndrome calculating means:
  - for computing syndromes in all the n dimensions including a first dimension and a second dimension different from the first dimension in a single step,
  - for calculating all the syndromes in all dimensions once during a first decoding step before any further decoding steps are performed by said decoder, and
  - for outputting the syndromes to the syndrome processing means;
- the syndrome processing means:
  - for processing the syndromes output from the syndrome calculating means in the first dimension during a first iteration, comprising:
    - calculating error positions and error values of the syndromes in the first iteration; and
    - updating the syndromes in the first dimension and the second dimension when the syndromes are changed based on the error positions and error values calculated in the first iteration;
  - for processing the syndromes output from the syndrome calculating means in the second dimension during a second iteration, comprising:
    - calculating error positions and error values of the syndromes in the second iteration; and
    - updating the syndromes in the first dimension and the second dimension when the syndromes are changed based on the error positions and error values calculated in the second iteration;
  - for processing only syndromes with a value different from zero or syndromes that have been updated during a previous decoding step for a second iteration up through a last iteration, and for outputting information based on the processed syndromes,
  - for updating all syndromes affected by a correction of a bit of data during subsequent decoding steps by said decoder;
  - wherein the syndrome processing means comprises storage means for storing the syndromes; and
- a data processing means:
  - for storing data received by the decoder data,
  - for correcting the data received by the decoder according to information output by the syndrome processing means and
  - for outputting the corrected data.

* * * * *